US009013220B2

(12) United States Patent
Park

(10) Patent No.: US 9,013,220 B2
(45) Date of Patent: Apr. 21, 2015

(54) SEMICONDUCTOR APPARATUS AND SEMICONDUCTOR SYSTEM

(71) Applicant: SK Hynix Inc., Icheon-si Gyeonggi-do (KR)

(72) Inventor: Heat Bit Park, Icheon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/100,494

(22) Filed: Dec. 9, 2013

(65) Prior Publication Data
US 2014/0374923 A1 Dec. 25, 2014

(30) Foreign Application Priority Data
Jun. 20, 2013 (KR) .................. 10-2013-0070830

(51) Int. Cl.
G06F 13/00 (2006.01)
G11C 7/20 (2006.01)
H01L 25/065 (2006.01)
G11C 7/22 (2006.01)
G06F 13/40 (2006.01)

(52) U.S. Cl.
CPC ............ *H01L 25/0657* (2013.01); *G11C 7/222* (2013.01); *G06F 13/4068* (2013.01); *G06F 13/00* (2013.01)

(58) Field of Classification Search
CPC ...... G11C 7/222; G06F 13/4068; G06F 13/00; H01L 25/0657
USPC ........................................................ 327/299
See application file for complete search history.

(56) References Cited

U.S. PATENT DOCUMENTS

| 7,863,960 B2 * | 1/2011 | Wang et al. ............... 327/291 |
| 8,525,569 B2 * | 9/2013 | Bucelot et al. ............ 327/293 |
| 2010/0277210 A1 * | 11/2010 | Wang et al. ............... 327/147 |

FOREIGN PATENT DOCUMENTS

| KR | 101124251 B1 | 2/2012 |
| KR | 101190689 B1 | 10/2012 |

* cited by examiner

*Primary Examiner* — Evan Pert
(74) *Attorney, Agent, or Firm* — William Park & Associates Patent Ltd.

(57) ABSTRACT

Provided is a semiconductor apparatus including a plurality of semiconductor chips coupled through an electrical coupling unit. Each of the semiconductor chips includes: a chip ID signal generation unit configured to generate a chip ID signal; and a chip enable signal generation unit configured to receive a clock enable signal in response to the chip ID signal, wherein one of the semiconductor chips shares the received clock enable signal as a transfer clock enable signal with the other semiconductor chips, and the chip enable signal generation unit detects whether or not an error occurs in the chip ID signals of the plurality of semiconductor chips, selects any one of the transfer clock enable signal and the clock enable signal applied, and outputs the selected signal as a chip enable signal.

20 Claims, 6 Drawing Sheets

SEMICONDUCTOR APPARATUS AND SEMICONDUCTOR SYSTEM

CROSS-REFERENCES TO RELATED APPLICATION

The present application claims priority under 35 U.S.C. §119(a) to Korean application number 10-2013-0070830, filed on Jun. 20, 2013, in the Korean Intellectual Property Office, which is incorporated herein by reference in its entirety.

BACKGROUND

1. Technical Field

Various embodiments relate to a semiconductor apparatus and a semiconductor system, and more particularly, to a semiconductor apparatus including multiple chips and a semiconductor system.

2. Related Art

In order to highly integrate a semiconductor apparatus, various types of multi-chip packages have been proposed. In particular, a chip stack package is widely used, which includes a plurality of semiconductor chips stacked to construct one semiconductor apparatus.

The plurality of semiconductor chips are electrically coupled to each other such that a controller for controlling the operation of the multi-chip semiconductor apparatus controls the respective semiconductor chips. Recently, a through-chip via has been used to commonly transmit a signal to a plurality of semiconductor chips. In general, since a semiconductor chip is made of silicon wafer, the through-chip via is referred to as a through-silicon via (TSV).

The semiconductor chips of the multi-chip semiconductor apparatus are divided into a master chip and slave chips. The master chip serves to buffer a signal applied from the controller and transmit the buffered signal to the respective slave chips, and each of the slave chips performs an operation according to a command and data received through the master chip. For example, when a clock enable signal to enable the semiconductor apparatus is applied from the controller, the master chip receives the clock enable signal and transmits the received clock enable signal to the respective slave chips, and each of the slave chips receives the clock enable signal and generates a chip enable signal to enable the corresponding chip.

SUMMARY

Various embodiments are directed to a technique for enabling each semiconductor chip in a multi-chip semiconductor apparatus.

In an embodiment of the present invention, there is provided a semiconductor apparatus including a plurality of semiconductor chips coupled through an electrical coupling unit. Each of the semiconductor chips includes: a chip ID signal generation unit configured to generate a chip ID signal; and a chip enable signal generation unit configured to receive a clock enable signal in response to the chip ID signal, wherein one of the semiconductor chips receiving the clock enable signal shares the received clock enable signal as a transfer clock enable signal with the other semiconductor chips, and the chip enable signal generation unit detects whether or not an error occurs in the chip ID signals of the plurality of semiconductor chips, selects any one of the transfer clock enable signal and the clock enable signal, and outputs the selected signal as a chip enable signal.

In an embodiment of the present invention, there is provided a semiconductor apparatus including a plurality of semiconductor chips coupled through an electrical coupling unit. Each of the semiconductor chips includes: a chip function determination unit configured to determine if the corresponding semiconductor chip is to operate as a master chip, through a chip ID signal of the semiconductor chip; a transmitting unit configured to receive a clock enable signal through an input terminal and form a transfer clock enable signal at an output terminal, according to the determination result of the chip function determination unit; an error detection unit configured to detect if two or more semiconductor chips operate as the master chip; a MUX unit configured to receive the transfer clock enable signal or the clock enable signal and selectively output the received signal; and a receiving unit configured to output the output of the MUX unit as a chip enable signal, and wherein the semiconductor chip receiving the clock enable signal through the transmitting unit shares the received clock enable signal as the transfer clock enable signal with the other semiconductor chips.

In an embodiment of the present invention, a semiconductor system includes: a controller; and first and second semiconductor chips electrically coupled through a through-chip via. Each of the first and second semiconductor chips includes: a chip function determination unit configured to determine if the corresponding semiconductor chip is to operate as a master chip through a chip ID signal; a transmitting unit configured to receive a clock enable signal through an input terminal and form a transfer clock enable signal at an output terminal , according to the determination result of the chip function determination unit; an error detection unit configured to detect if an error occurs in the chip ID signals of the first and second semiconductor chips; a MUX unit configured to select and output any one of the transfer clock enable signal and the clock enable signal; and a receiving unit configured to output the output of the MUX unit as a chip enable signal, wherein the semiconductor chip receiving the clock enable signal through the transmitting unit shares the received clock enable signal as the transfer clock enable signal with the other semiconductor chip, and the controller provides the clock enable signal to a semiconductor chip which is initially set to operate as the master chip among the first and second semiconductor chips.

In an embodiment of the present invention, a system comprises a plurality of semiconductor chips, wherein each of the semiconductor chips comprise: a chip signal generation unit configured to generate a chip ID signal to identify each semiconductor chip; and a chip enable signal generation unit configured to generate a chip enable signal in response to the chip ID signal and receive a clock enable signal to output as a transfer clock enable signal.

BRIEF DESCRIPTION OF THE DRAWINGS

Features, aspects, and embodiments are described in conjunction with the attached drawings, in which.

DETAILED DESCRIPTION

Hereinafter, a semiconductor apparatus and a semiconductor system according to the present invention will be described below with reference to the accompanying drawings through various embodiments.

Figure 1:
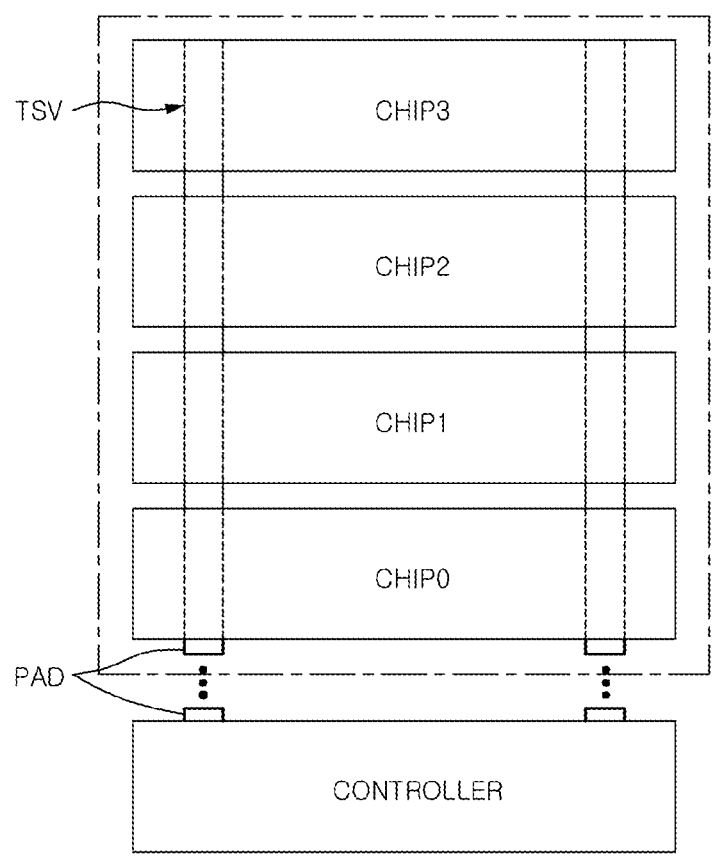
FIG. 1 illustrates a semiconductor system according to an embodiment of the present invention.

Referring to FIG. 1, a semiconductor system may include a semiconductor apparatus including a plurality of semiconductor chips CHIP0 to CHIP3 packaged therein and a controller CONTROLLER to control the semiconductor apparatus. The controller CONTROLLER and the semiconductor apparatus may exchange signals through a pad PAD exposed to the outside. As described above, the semiconductor apparatus may communicate with the controller CONTROLLER through a specific semiconductor chip set to a master chip among the plurality of semiconductor chips CHIP0 to CHIP3. In FIG. 1, the first semiconductor chip CHIP0 may be set to the master chip, and the other second to fourth semiconductor chips CHIP1 to CHIP3 are set to slave chips. FIG. 1 may illustrate a case in which the first to fourth semiconductor chips CHIP0 to CHIP3 are electrically coupled through a TSV. However, the configuration of the semiconductor apparatus may not be limited to an embodiment. Hereafter, a semiconductor apparatus including a plurality of semiconductor chips electrically coupled through a TSV will be taken as an example for description.

The first semiconductor chip CHIP0 may transmit a signal to the second to fourth semiconductor chips CHIP1 to CHIP3 through a TSV, and receive signals of the second to fourth semiconductor chips CHIP1 to CHIP3 through the TSV. That is, the first semiconductor chip CHIP0 and the second to fourth semiconductor chips CHIP1 to CHIP3 may perform two-way communication through the TSV.

The semiconductor apparatus may be enabled by receiving an activated clock enable signal (not illustrated) from the controller CONTROLLER. The first semiconductor chip CHIP0 set to the master chip may receive the clock enable signal through the pad PAD, and transmit the received clock enable signal to the second to fourth semiconductor chips CHIP1 to CHIP3. Each of the first to fourth semiconductor chips CHIP0 to CHIP3 may receive the clock enable signal and generate a chip enable signal (not illustrated) to enable the corresponding chip.

Figure 2:
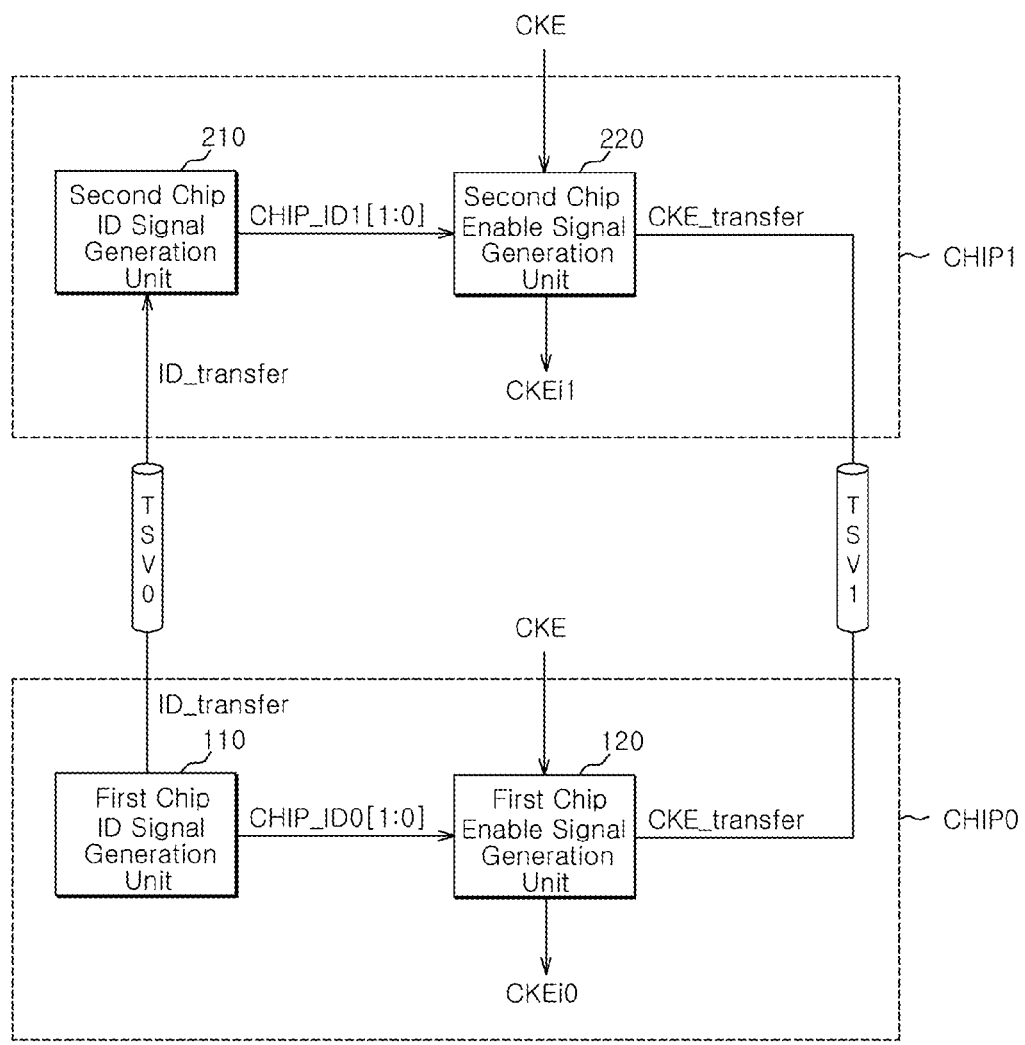
FIG. 2 is a block diagram illustrating an embodiment for first and second semiconductor chips of FIG. 1.

FIG. 2 illustrates an embodiment for a scheme to enable the semiconductor apparatus of FIG. 1. FIG. 2 representatively illustrates the first semiconductor chip CHIP0 functioning as the master chip and the second semiconductor chip CHIP1 functioning as a slave chip. The master chip and the slave chip are classified depending on the functions thereof, but the semiconductor apparatus includes the same type of chips.

The semiconductor chips CHIP0 and CHIP1 include ID signal generation units 110 and 210 and chip enable signal generation units 120 and 220, respectively, in order to generate the chip enable signal.

The semiconductor chips CHIP0 and CHIP1 may be set to have unique IDs for identification. The chip ID signal generation units 110 and 210 may be configured to generate chip ID signals CHIP_ID0[1:0] and CHIP_ID1[1:0] of the respective semiconductor chips CHIP0 and CHIP1. The chip ID signal CHIP_ID0[1:0] of the first semiconductor chip CHIP0 may influence the generation of the chip ID signal CHIP_ID1[1:0] of the semiconductor chip CHIP1 such that the semiconductor chips CHIP0 and CHIP1 generate different chip ID signals CHIP_ID0[1:0] and CHIP_ID1[1:0]. Specifically, the first and second semiconductor chips CHIP0 and CHIP1 may share a transfer ID signal ID_transfer through a first TSV TSV0, thereby generating different chip ID signals CHIP_ID0[1:0] and CHIP_ID1[1:0].

The chip enable signal generation units 120 and 220 generate chip enable signals CKEi0 and CKEi1 for the respective chips in response to the chip ID signals CHIP_ID0[1:0] and CHIP_ID1[1:0]. When a corresponding chip is determined to be the master chip through the chip ID signal CHIP_ID0[1:0] or CHIP_ID1[1:0], the chip enable signal generation unit 120 or 220 may receive a clock enable signal CKE from outside and output the received signal as a transfer clock enable signal CKE_transfer. The transfer clock enable signal CKE_transfer is a clock enable signal CKE received by the semiconductor chip determined to be the master chip, and shared by the first and second semiconductor chips CHIP0 and CHIP1 through a second TSV TSV1. The chip enable signal generation units 120 and 220 output the transfer clock enable signal CKE_transfer as the respective chip enable signals CKEi0 and CKEi1.

Specifically, the first semiconductor chip CHIP0 may include a first chip ID signal generation unit 110 and a first chip enable signal generation unit 120.

The first chip ID signal generation unit 110 may be configured to generate the first chip ID signal CHIP_ID0[1:0]. In an embodiment, the first semiconductor chip CHIP0 may be set to operate as the master chip to transfer and receive a signal to and from the controller. Through the first chip ID signal CHIP_ID0[1:0] of the first semiconductor chip CHIP0, it can be seen that the corresponding chip is set to the master chip.

The first chip enable signal generation unit 120 may be configured to determine whether or not to receive the clock enable signal CKE from outside, in response to the first chip ID signal CHIP_ID0[1:0]. When the corresponding semiconductor chip is determined to be the master chip through the first chip ID signal CHIP_ID0[1:0], the first chip enable signal generation unit 120 may receive the clock enable signal CKE applied from an external controller and transfer the received signal as the transfer clock enable signal CKE_transfer. Furthermore, the first chip enable signal generation unit 120 may output the transfer clock enable signal CKE_transfer as the first chip enable signal CKEi0.

The second semiconductor chip CHIP1 may include a second chip ID signal generation unit 210 and a second chip enable signal generation unit 220.

The second chip ID signal generation unit 210 may be configured to receive the transfer ID signal ID_transfer through the first TSV TSV0 and generate a second chip ID signal CHIP_ID1[1:0]. In an embodiment, the second semiconductor chip CHIP1 may be set to operate as one of the slave chips. Through the second chip ID signal CHIP_ID1[1:0] of the second semiconductor chip CHIP1, it can be seen that the corresponding chip is set to a slave chip.

The second chip enable signal generation unit 220 may be configured to determine whether or not to receive the clock enable signal CKE from outside, in response to the second chip ID signal CHIP_ID1[1:0]. When the corresponding chip is determined to be a slave chip through the second chip ID signal CHIP_ID1[1:0], the second chip enable signal generation unit 220 may block the coupling between an input terminal to receive the clock enable signal CKE and an output terminal to output the transfer clock enable signal CKE_transfer. At this time, the clock enable signal CKE may not be directly applied to the slave chip. Thus, when an error occurs in the second chip ID signal CHIP_ID1[1:0] such that the corresponding chip is determined to be the master, a voltage level in a floating state may be outputted as the transfer clock enable signal CKE_transfer.

Figure 3:
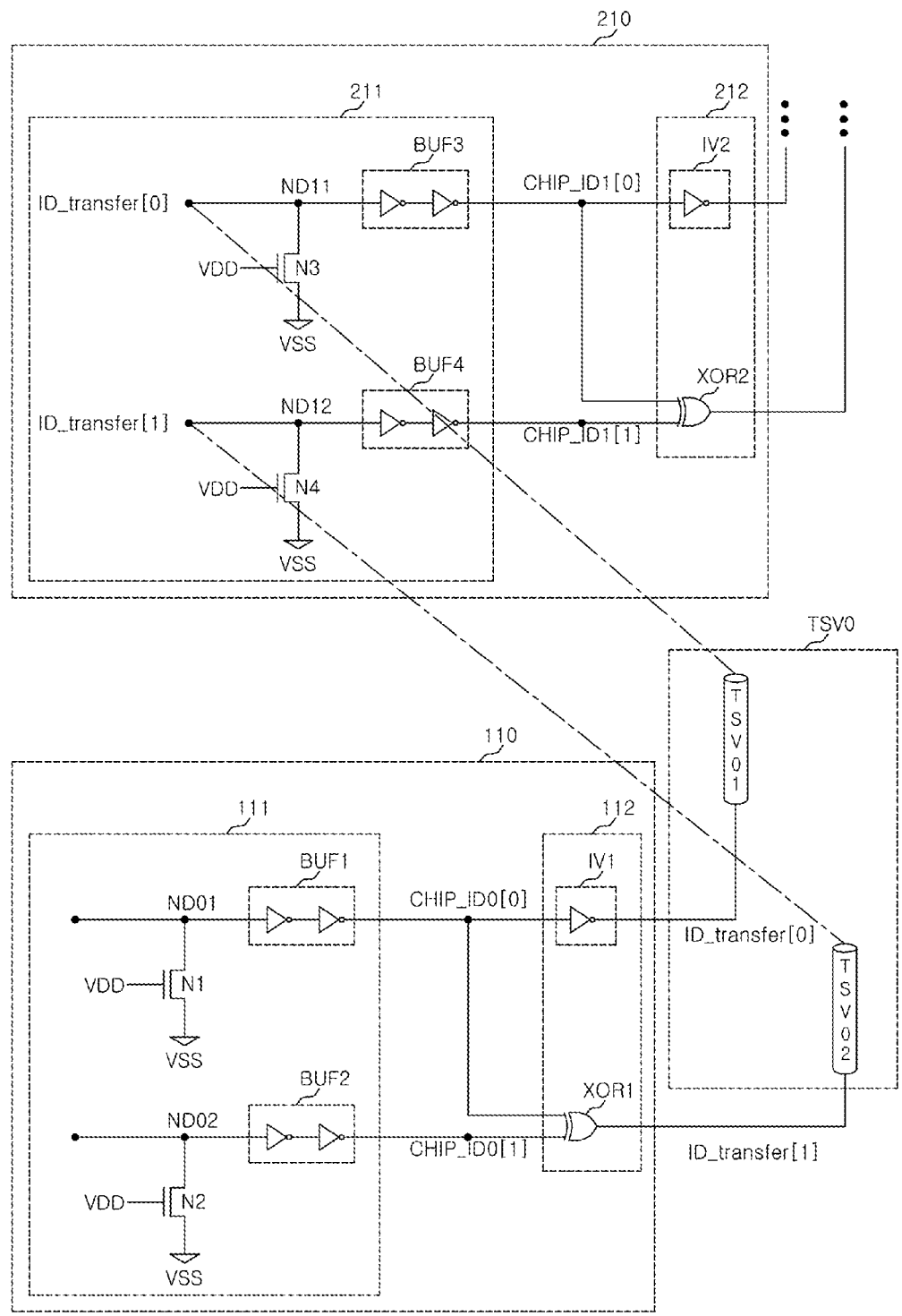
FIG. 3 is a circuit diagram illustrating an embodiment for first and second chip ID signal generation units of FIG. 2.

FIG. 3 is a circuit diagram illustrating an embodiment for the first and second chip ID signal generation units 110 and 210.

The first and second chip ID signal generation units 110 and 210 may include signal generation sections 111 and 211 and transfer sections 112 and 212, respectively. In an embodiment, each of the chip ID signals CHIP_ID0[1:0] and CHIP_ID1[1:0] is implemented with a two-bit signal, but is not limited thereto.

The first chip ID signal generation unit 110 may include a first signal generation section 111 and a first transfer section 112.

The first signal generation section 111 may include first and second NMOS transistors N1 and N2 and first and second buffers BUF1 and BUF2. The first NMOS transistor N1 may be coupled between a node ND01 and a ground voltage VSS, and the first buffer BUF1 may be configured to buffer the voltage level of the node ND01 and output the buffered signal as a lower bit CHIP_ID0[0] of the first chip ID signal. The second NMOS transistor N2 may be coupled between a node ND02 and the ground voltage VSS, and the second buffer BUF2 may be configured to buffer the voltage level of the node ND02 and output the buffered signal as an upper bit CHIP_ID0[1] of the first chip ID signal. Since an external voltage VDD is supplied to gate terminals of the first and second NMOS transistors N1 and N2, both of the first and second buffers BUF1 and BUF2 output a low-level voltage, and thus the first chip ID signal CHIP_ID0[1:0] becomes '00'.

The first transfer section 112 may include a first inverter IV1 and a first XOR gate XOR1. The first inverter IV1 may be configured to receive the lower bit CHIP_ID0[0] of the first chip ID signal and output a lower bit ID_transfer[0] of the transfer ID signal. The first XOR gate XOR1 may be configured to receive the lower bit CHIP_ID0[0] of the first chip ID signal and the upper bit CHIP_ID0[1] of the first chip ID signal and output an upper bit ID_transfer[1] of the transfer ID signal. Thus, the transfer ID signal ID_transfer[1:0] becomes '01'.

The first TSV TSV0 may include first and second TSVs TSV01 and TSV02. The respective bits of the transfer ID signal ID_transfer[1:0] may be transferred to the second chip ID signal generation unit 210 of the second semiconductor chip through the first and second TSVs TSV01 and TSV02.

The second signal generation section 211 may include third and fourth NMOS transistors N3 and N4 and third and fourth buffers BUF3 and BUF4. The third NMOS transistor N3 may be coupled between a node ND11 and the ground voltage VSS, and the third buffer BUF3 may be configured to buffer the voltage level of the node ND11 and output the buffered signal as a lower bit CHIP_ID1[0] of the second chip ID signal. The fourth NMOS transistor N4 may be coupled between a node ND12 and the ground voltage VSS, and the fourth buffer BUF4 may be configured to buffer the voltage level of the node ND12 and output the buffered signal as an upper bit CHIP_ID1[1] of the second chip ID signal. The third and fourth NMOS transistors N3 and N4 receive the external voltage VDD through gate terminals thereof. Thus, the voltage levels of the respective nodes ND11 and ND12 may be discharged to the ground voltage level VSS.

The first and second TSVs TSV01 and TSV02 may be coupled to the respective nodes ND11 and ND12 so as to transfer the transfer ID signal ID_transfer[1:0]. Since the drivability of the first and second TSVs TSV01 and TSV02 is set to be larger than the drivability of the third and fourth NMOS transistors N3 and N4, the voltage levels of the respective nodes ND11 and ND12 may be set to the level of the transfer ID signal ID_transfer[1:0]. Thus, the third buffer BUF3 may output a high-level voltage, and the fourth buffer BUF4 may output a low-level voltage. As a result, the second chip ID signal CHIP_ID1[1:0] may be outputted as '01'.

The second transfer section 212 may include a second inverter IV2 and a second XOR gate XOR2. The second inverter IV2 may be configured to receive the lower bit CHIP_ID1[0] of the second chip ID signal, and the second XOR gate XOR2 may be configured to receive the lower bit CHIP_ID1[0] of the second chip ID signal and the upper bit CHIP_ID1[1] of the second chip ID signal. Although omitted in FIG. 3, the output of the second transfer section 212 may be transferred to a chip ID signal generation unit of another semiconductor chip coupled thereto.

In this way, since the chip ID signal CHIP_ID0[1:0] of the first semiconductor chip may influence the generation of the chip ID signal CHIP_ID1[1:0] of the second semiconductor chip, the first and second semiconductor chips may generate different ID signals. However, when a defect occurs in the first and second TSVs TSV01 and TSV02, the level of the transfer ID signal ID_transfer[1:0] transferred from the first transfer section 112 may differ from the level of the transfer ID signal ID_transfer[1:0] received by the second signal generation section 211. In this case, the respective semiconductor chips may unexpectedly generate the same chip ID signal. For example, although the second chip ID signal CHIP_ID1[1:0] must be generated as the preset ID of the slave chip, the second chip ID signal CHIP_ID1[1:0] may be generated as the ID of the master chip.

Figure 4:
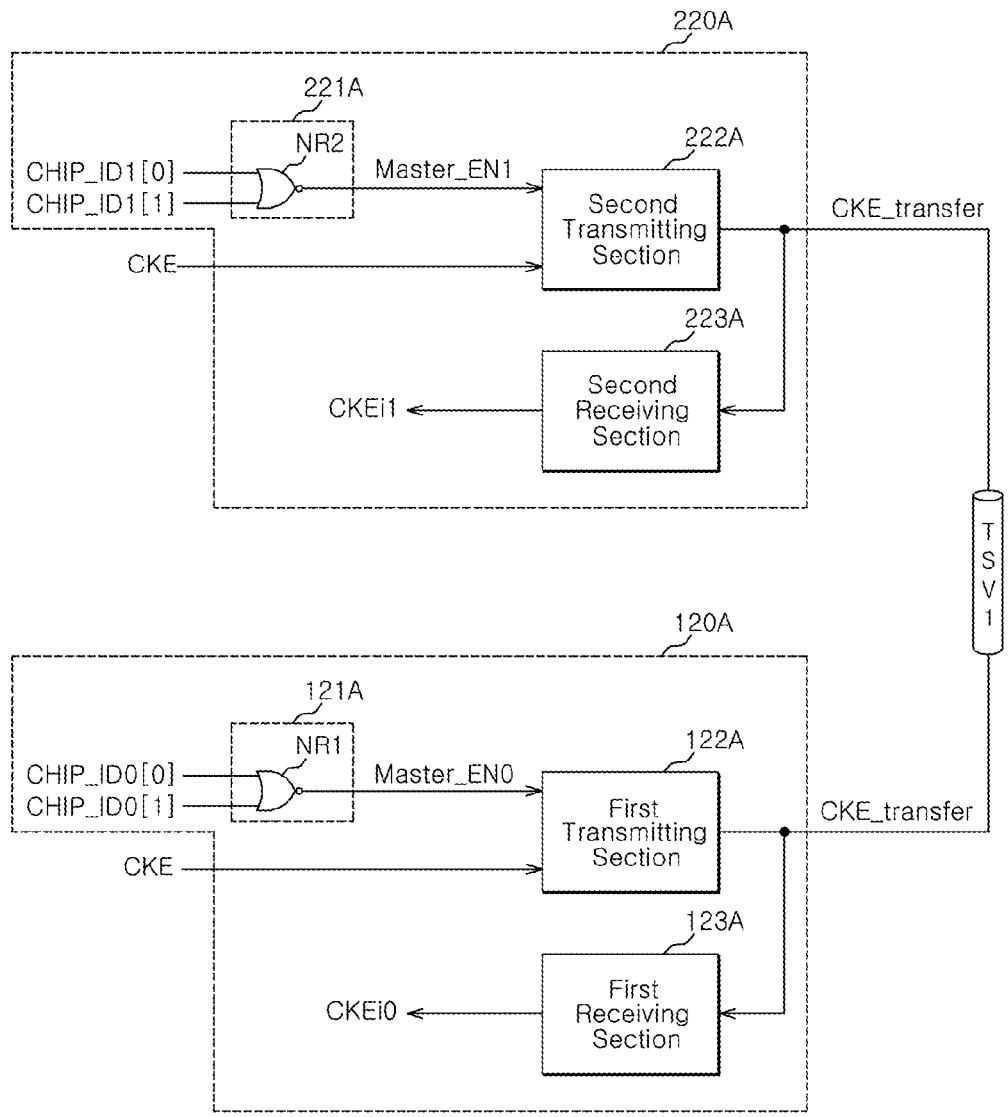
FIG. 4 is a circuit diagram illustrating an embodiment for first and second chip enable signal generation units of FIG. 2.

FIG. 4 is a circuit diagram illustrating an embodiment for the first and second chip enable signal generation units 120A and 220A.

The first and second chip enable signal generation units 120A and 220A of the respective semiconductor chips according to an embodiment of the present invention may include chip function determination sections 121A and 221A, transmitting sections 122A and 222A, and receiving sections 123A and 223A, respectively. The transmitting sections 122A and 222A of the respective semiconductor chips may have output terminals electrically coupled through the second TSV TSV1.

Specifically, the first chip enable signal generation unit 120A may include a first chip function determination section 121A, a first transmitting section 122A, and a first receiving section 123A.

The first chip function determination section 121A may be configured to receive the respective bits of the first chip ID signal CHIP_ID0[1:0] and generate a first master enable signal Master_EN0. That is, when the first semiconductor chip is determined to be the master chip through the first chip ID signal CHIP_ID0[1:0], the first chip function determination section 121A may activate the first master enable signal Master_EN0. Specifically, the first chip function determination section 121A may include a first NOR gate NR1. In an embodiment, since the first chip ID signal CHIP_ID0[1:0] is '00', the first NOR gate NR1 outputs the first master enable signal Master_EN0 activated to a high level.

The first transmitting section 122A may be configured to receive the clock enable signal CKE through an input terminal thereof and transfer the received signal to an output terminal thereof, when the activated first master enable signal Master_EN0 is applied. The signal formed at the output terminal is the transfer clock enable signal CKE_transfer. The transfer clock enable signal CKE_transfer of the first semiconductor chip may be shared by the second semiconductor chip through the second TSV TSV1. In an embodiment, when the activated clock enable signal CKE is applied, the activated transfer clock enable signal CKE_transfer may be transferred to the output terminal of the first transmitting section 122A. For example, both of the clock enable signals CKE and the transfer clock enable signals CKE_transfer may be activated to a high level.

The first receiving section 123A may be configured to receive the transfer clock enable signal CKE_transfer and output the received signal as the first chip enable signal CKEi0. When the activated transfer clock enable signal CKE_transfer is applied, the first receiving section 123A may activate the first chip enable signal CKEi0. In this case, the first semiconductor chip may be enabled.

The second chip enable signal generation unit 220A may include a second chip function determination section 221A, a second transmitting section 222A, and a second receiving section 223A.

The second chip function determination section 221A may be configured to receive the respective bits of the second chip ID signal CHIP_ID1[1:0] and generate a second master enable signal Master_EN1. That is, when the second semiconductor chip is determined to be the master chip through the second chip ID signal CHIP_ID1[1:0], the second chip function determination section 221A may activate the second master enable signal Master_EN1. Specifically, the second chip function determination section 221A may include a second NOR gate NR2. In an embodiment, since the second chip ID signal CHIP_ID1[1:0] is '01', the second NOR gate NR2 may output the second master enable signal Master_EN0 deactivated to a low level.

The second transmitting section 222A may be configured to receive the clock enable signal CKE through an input terminal thereof and transfer the received signal to an output terminal thereof, when the activated second master enable signal Master_EN1 is applied. In an embodiment, since the deactivated second master enable signal Master_EN1 is applied, the electrical coupling between the input terminal and the output terminal of the second transmitting section 222A may be blocked. However, the transfer clock enable signal CKE_transfer activated to a high level and shared through the second TSV TSV1 may be formed at the output terminal as described above.

The second receiving section 223A may be configured to receive the transfer clock enable signal CKE_transfer and output the received signal as the second chip enable signal CKEi1. Since the activated transfer clock enable signal CKE_transfer is applied, the second receiving section 223A may activate the second chip enable signal CKEi1. Thus, the second semiconductor chip is enabled.

In the semiconductor apparatus of FIG. 4 according to an embodiment of the present invention, the slave chips may share the clock enable signal received by the semiconductor chip determined to be master chip, and thus the respective chips included in the semiconductor apparatus may be enabled. However, when an error occurs in which a slave chip is determined to be the master chip due to a defect in a TSV of the semiconductor apparatus, the slave chip may operate as the master chip, and the level of the transfer clock enable signal CKE_transfer may become unstable. Thus, an all kill may occur so that all of the semiconductor chips inside the semiconductor apparatus are disabled.

Figure 5:
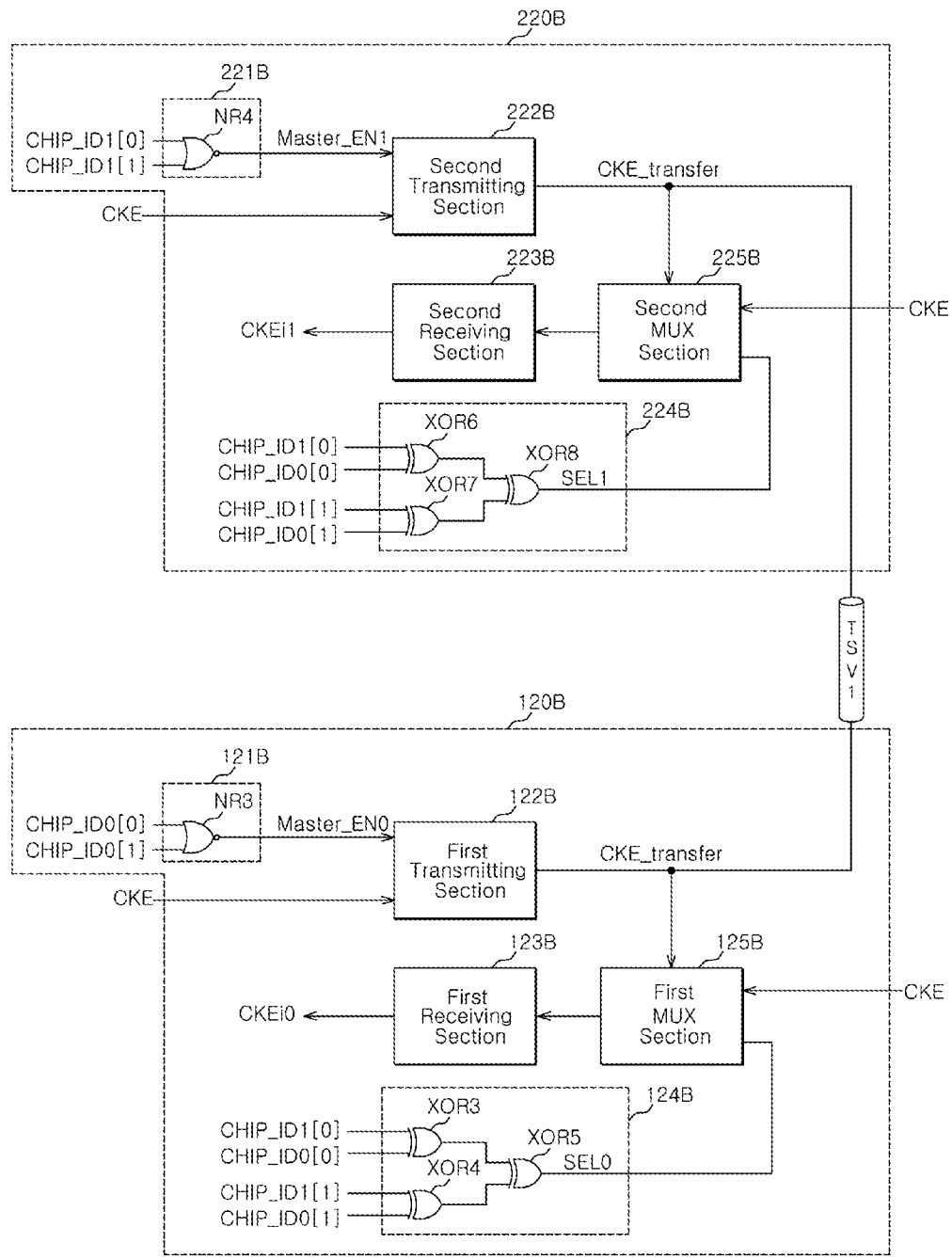
FIG. 5 is a circuit diagram illustrating an embodiment for the first and second chip enable signal generation units of FIG. 2.

FIG. 5 is a circuit diagram illustrating first and second chip enable signal generation units 120B and 220B according to an embodiment for solving the above-described problem.

The chip enable signal generation units 120B and 220B of the respective semiconductor chips according to an embodiment may include chip function determination sections 121B and 221B, transmitting sections 122B and 222B, receiving sections 123B and 223B, error detection sections 124B and 224B, and MUX sections 125B and 225B, respectively. The transmitting sections 122B and 222B of the respective semiconductor chips may have output terminals electrically coupled through the second TSV TSV1.

Specifically, the first chip enable signal generation unit 120B includes a first chip determination section 121B, a first transmitting section 122B, a first receiving section 123B, a first error detection section 124B, and a first MUX section 125B.

The first chip function determination section 121B may be configured to receive the respective bits of the first chip ID signal CHIP_ID0[1:0] and generate the first master enable signal Master_EN0. Since the first chip function determination section 121B has the same configuration and operation as the first chip function determination section 121A of FIG. 4, the detailed descriptions thereof are omitted herein.

The first transmitting section 122B may be configured to receive the clock enable signal CKE through an input terminal thereof and transfer the received signal to an output terminal thereof, when the activated first master enable signal Master_EN0 is applied. Suppose that the signal formed at the output terminal is the transfer clock enable signal CKE_transfer. The transfer clock enable signal CKE_transfer of the first semiconductor chip may be shared by the second semiconductor chip through the second TSV TSV1. Since the first transmitting section 122B has the same configuration and operation as the first transmitting section 122A of FIG. 4, the detailed descriptions thereof are omitted herein.

The first error detection section 124B may be configured to detect whether or not an error occurred in the first chip ID signal CHIP_ID0[1:0] and the second chip ID signal CHIP_ID1[1:0], and generate a first select signal SEL0. The first error detection section 124B according to an embodiment may use a scheme for determining whether or not the chip ID signal of a semiconductor chip set to a slave chip is equal to the chip ID signal of a semiconductor chip set to the master chip.

The first error detection section 124B may include third to fifth XOR gates XOR3 to XOR5. The third XOR gate XOR3 may be configured to compare lower bits CHIP_ID0[0] and CHIP_ID1[0] of the first and second chip ID signals. The fourth XOR gate XOR4 may be configured to compare the upper bits CHIP_ID0[1] and CHIP_ID1[1] of the first and second chip ID signals. The fifth XOR gate XOR5 may be configured to receive outputs of the third and fourth XOR gates XOR3 and XOR4 and output the first select signal SEL0. Thus, the first error detection section 124B may output the first select signal SEL0 at a high level, that is, a first level, when the first and second chip ID signals CHIP_ID0[1:0] and CHIP_ID1[1:0] are different from each other; and output the first select signal SEL0 at a low level, that is, a second level, when the first and second chip ID signals CHIP_ID0[1:0] and CHIP_ID1[1:0] are equal to each other. The first and second chip ID signals CHIP_ID0[1:0] and CHIP_ID1[1:0] may be transferred to another semiconductor chip which is electrically coupled through the respective TSVs.

Figure 6:
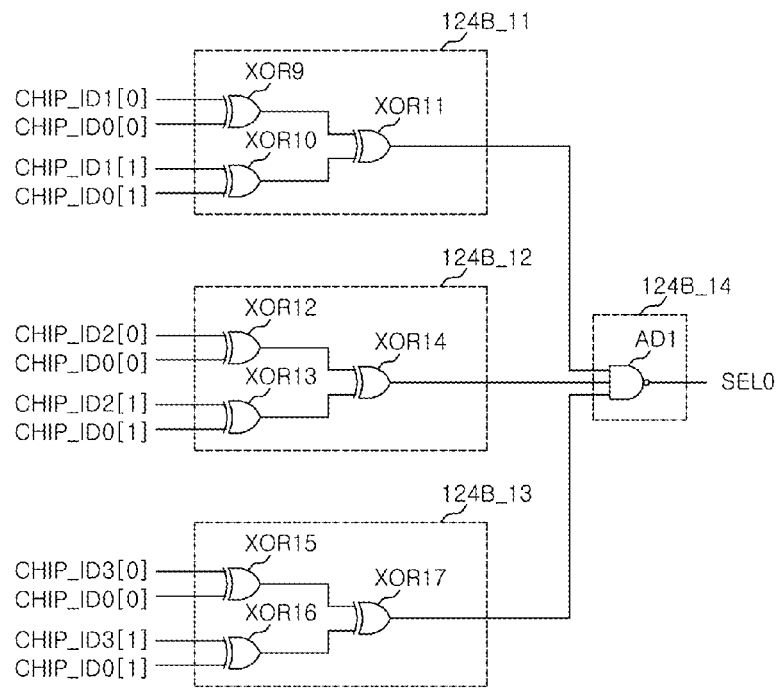
FIG. 6 is a circuit diagram illustrating an embodiment for a first error detection section of FIG. 5.

FIG. 6 illustrates an embodiment for the first error detection section 124B_1 when the semiconductor apparatus includes one master chip and a plurality of slave chips.

In an embodiment, an error may be detected in the same manner as an embodiment of FIG. 5. That is, a chip ID signal of a semiconductor chip set to a master chip and a chip ID signal of a semiconductor chip set to a slave chip may be compared to each other, and an error may be detected according to the comparison result. The chip ID signals CHIP_ID1[1:0], CHIP_ID2[1:0], and CHIP_ID3[1:0] of the respective semiconductor chips set to slave chips may be compared to the chip ID signal CHIP_ID0[1:0] of the semiconductor chip set to the master chip.

FIG. 6 illustrates a case in which the semiconductor apparatus may include the first semiconductor chip set to the master chip and the second to fourth semiconductor chips set to slave chips. The first error detection section 124B_1 may include first to third comparators 124B_11 to 124B_13 and a combiner 124B_14.

The first comparator 124B_11 may include ninth to 11th XOR gates XOR9 to XOR11. The ninth XOR gate XOR9 may be configured to compare the lower bits CHIP_ID0[0] and CHIP_ID1[0] of the first and second chip ID signals. The tenth XOR gate XOR10 may be configured to compare the upper bits CHIP_ID0[1] and CHIP_ID1[1] of the first and second chip ID signals. The 11th XOR gate XOR11 may be configured to receive outputs of the ninth and tenth XOR gates XOR9 and XOR10. Thus, the first comparator 124B_11 may output a high level, that is, a first level when the first and second chip ID signals CHIP_ID0[1:0] and CHIP_ID1[1:0] are different from each other; and may output a low level, that is, a second level when the first and second chip ID signals CHIP_ID0[1:0] and CHIP_ID1[1:0] are equal to each other.

The second comparator 124B_12 may include 12th to 14th XOR gates XOR12 to XOR14. The 12th XOR gate XOR12 may be configured to compare lower bits CHIP_ID0[0] and CHIP_ID2[0] of the first and third chip ID signals. The 13th XOR gate XOR13 may be configured to compare upper bits CHIP_ID0[1] and CHIP_ID2[1] of the first and third chip ID signals. The 14th XOR gate XOR14 may be configured to receive outputs of the 12th and 13th XOR gates XOR12 and XOR13. Thus, the second comparator 124B_12 may output a high level, that is, the first level when the first and third chip ID signals CHIP_ID0[1:0] and CHIP_ID2[1:0] are different from each other; and may output a low level, that is, the second level when the first and third chip ID signals CHIP_ID0[1:0] and CHIP_ID2[1:0] are equal to each other.

The third comparator 124B_13 may include 15th to 17th XOR gates XOR15 and XOR17. The 15th XOR gate XOR15 may be configured to compare lower bits CHIP_ID0[0] and CHIP_ID3[0] of the first and fourth chip ID signals. The 16th XOR gate XOR16 may be configured to compare upper bits CHIP_ID0[1] and CHIP_ID3[1] of the first and fourth chip ID signals. The 17th XOR gate XOR17 may be configured to receive outputs of the 15th and 16th XOR gates XOR15 and XOR16. Thus, the third comparator 124B_13 may output a high level, that is, the first level when the first and fourth chip ID signals CHIP_ID0[1:0] and CHIP_ID3[1:0] are different from each other; and may output a low level, that is, the second level when the first and fourth chip ID signals CHIP_ID0[1:0] and CHIP_ID3[1:0] are equal to each other.

The combiner 124B_14 may include a first AND gate AD1 configured to receive outputs of the first to third comparators 124B_11 to 124B_13 and output the first select signal SEL0. The combiner 124B_14 may output the first select signal SEL0 at the first level when all of the outputs of the first to third comparators 124B_11 to 124B_13 are at a high level; and output the first select signal SEL0 at the second level when any one of the outputs of the first to third comparators 124B_11 to 124B_13 are at a low level.

That is, the combiner 124B_14 may generate the first select signal SEL0 at the first level when the chip ID signals of the semiconductor chips set to slave chips are different from the chip ID signal of the semiconductor chip set to the master chip; and may generate the first select signal SEL0 at the second level when any one of the chip ID signals of the semiconductor chips set to slave chips is equal to the chip ID signal of the semiconductor chip set to the master chip.

The first MUX section 125B of FIG. 5 may be configured to select the clock enable signal CKE applied from outside or the transfer clock enable signal CKE_transfer in response to the first select signal SEL0, and output the selected signal to the first receiving section 123B. The first MUX section 125B may select the transfer clock enable signal CKE_transfer when the first select signal SEL0 at the first level is applied, and select the clock enable signal CKE when the first select signal SEL0 at the second level is applied.

Figure 7:
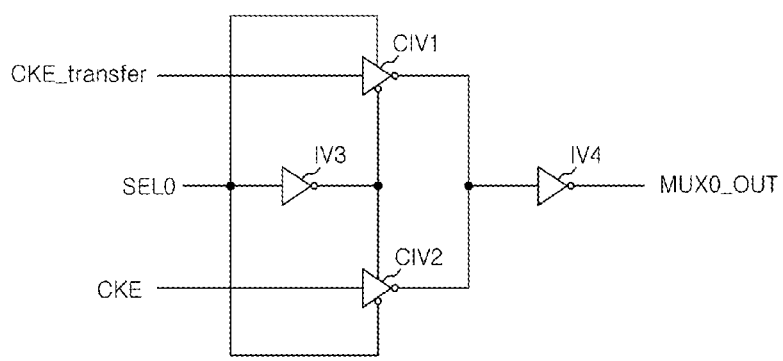
FIG. 7 is a circuit diagram illustrating an embodiment for a first MUX section of FIG. 5.

Referring to FIG. 7, the first MUX section 125B may include third and fourth inverters IV3 and IV4 and first and second control inverters CIV1 and CIV2.

The third inverter IV3 may be configured to invert the first select signal SEL0.

The first control inverter CIV1 may be configured to invert the transfer clock enable signal CKE_transfer in response to the first select signal SEL0 and an output signal of the third inverter IV3.

The second control inverter CIV2 may be configured to invert the clock enable signal CKE in response to the first select signal SEL0 and the output signal of the third inverter IV3.

The fourth inverter IV4 may be configured to invert outputs of the first and second control inverters CIV1 and CIV2 and output the inverted signals as an output signal MUX0_OUT.

The first receiving section 123B may be configured to receive an output of the first MUX section 125B and output the received signal as the first chip enable signal CKEi0.

The first chip enable signal generation unit 120B of FIG. 5 normally may output the transfer clock enable signal CKE_transfer outputted from the first transmitting section 122B as the first chip enable signal CKEi0 when no error occurs in the chip ID signals of the semiconductor chips. On the other hand, when an error occurs in which a chip ID signal of a slave chip is equal to the chip ID signal of the master chip, the voltage level of the transfer clock enable signal CKE_transfer may become unstable. Thus, the first chip enable signal generation unit 120B may receive the clock enable signal CKE applied from outside instead of the transfer clock enable signal CKE_transfer, and output the received signal as the first chip enable signal CKEi0.

The second chip enable signal generation unit 220B may include a second chip function determination section 221B, a second transmitting section 222B, a second receiving section 223B, a second error detection section 224B, and a second MUX section 225B.

The second chip function determination section 221B may be configured to receive the respective bits of the second chip ID signal CHIP_ID1[1:0] and generate the second master enable signal Master_EN1. Since the second chip function determination section 221B has the same configuration and operation as the second chip function determination section 221A of FIG. 4, the detailed descriptions thereof are omitted herein.

The second transmitting section 222B may be configured to receive the clock enable signal CKE through an input terminal thereof and transmit the received signal to an output terminal thereof, when the activated second master enable signal Master_EN1 is applied. Since the second semiconductor chip is not directly coupled to the external controller, the input terminal may be substantially in a floating state. That is, when the normally-deactivated second master enable signal Master_EN1 is applied, the electrical coupling between the input terminal and the output terminal of the second transmitting section 222B may be blocked. However, when the abnormally-activated second master enable signal Master_EN1 is applied, the unstable voltage level of the input terminal in a floating state is outputted as the transfer clock enable signal CKE_transfer. The unstable transfer clock enable signal CKE_transfer may be shared by the first semiconductor chip through the second TSV TSV1.

The second error detection section 224B may be configured to detect whether or not an error occurred in the first chip ID signal CHIP_ID0[1:0] and the second chip ID signal CHIP_ID1[1:0], and generate the second select signal SEL1. The second error detection section 224B may have the same configuration and operation as the first error detection section 124B. The second error detection section 224B may include sixth to eighth XOR gates XOR6 to XOR8 to compare the first chip ID signal CHIP_ID0[1:0] and the second chip ID signal CHIP_ID1[1:0]. The detailed descriptions thereof are omitted herein.

The second MUX section 225B may be configured to select the clock enable signal CKE applied from outside or the transfer clock enable signal CKE_transfer in response to the second select signal SEL1, and output the selected signal to the second receiving section 223B. The second MUX section 225B may select the transfer clock enable signal CKE_transfer when the second select signal SEL1 at the first level is applied, and select the clock enable signal CKE when the second select signal SEL1 at the second level is applied. As described above, however, the second semiconductor chip may not be directly coupled to the external controller. Thus, the input terminal to receive the clock enable signal CKE may substantially be in a floating state. The second MUX section 225B may have the same configuration and operation as the first MUX section 125B.

The second receiving section 223B may be configured to receive the output of the second MUX section 225B and output the received signal as the second chip enable signal CKEi1.

When no error occurs in the chip ID signals of the semiconductor chips, the second chip enable signal generation unit 220B may output the transfer clock enable signal CKE_transfer as the second chip enable signal CKEi1. On the other hand, when a chip ID signal of a slave chip is equal to the chip ID signal of the master chip, that is, when an error occurs, the second chip enable signal generation 220B may receive the clock enable signal CKE applied from outside and outputs the received signal as the second chip enable signal CKEi1. In the latter case, however, since the input terminal to receive the clock enable signal CKE of the second MUX section 225B is substantially in a floating state, the second chip enable signal generation unit 220B may generate the unstable second chip enable signal CKEi1.

According to an embodiment illustrated in FIG. 5, when an error occurs in which a slave chip is determined to be the master chip due to a defect of a TSV in the semiconductor apparatus, the semiconductor chips included in the semiconductor apparatus may directly receive the clock enable signal CKE applied from outside instead of the transfer clock enable signal CKE_transfer, and generate the chip enable signal. Thus, the semiconductor apparatus according to an embodiment may guarantee at least a normal operation of the master chip.

While certain embodiments have been described above, it will be understood to those skilled in the art that the embodiments described are by way of example only. Accordingly, the semiconductor apparatus described herein should not be limited based on the described embodiments. Rather, the semiconductor apparatus described herein should only be limited in light of the claims that follow when taken in conjunction with the above description and accompanying drawings.

What is claimed is:

1. A semiconductor apparatus comprising a plurality of semiconductor chips coupled through an electrical coupling unit,
wherein each of the semiconductor chips comprises:
a chip ID signal generation unit configured to generate a chip ID signal; and
a chip enable signal generation unit configured to receive a clock enable signal in response to the chip ID signal,
wherein one of the semiconductor chips receiving the clock enable signal shares the received clock enable signal as a transfer clock enable signal with the other semiconductor chips, and
the chip enable signal generation unit detects whether or not an error occurs in the chip ID signals of the plurality of semiconductor chips, selects any one of the transfer clock enable signal and the clock enable signal, and outputs the selected signal as a chip enable signal.

2. The semiconductor apparatus according to claim 1, wherein a first chip ID signal of a first semiconductor chip among the plurality of semiconductor chips influences generation of a second ID signal of a second semiconductor chip among the plurality of semiconductor chips.

3. The semiconductor apparatus according to claim 1, wherein the chip enable signal generation unit receives the clock enable signal from outside, when the corresponding semiconductor chip is determined to be a master chip through the chip ID signal of the semiconductor chip.

4. The semiconductor apparatus according to claim 1, wherein the chip enable signal generation unit outputs the clock enable signal as the chip enable signal of the corresponding semiconductor chip when two or more semiconductor chips among the plurality of semiconductor chips have the same chip ID signal, and outputs the transfer clock enable signal as the chip enable signal of the corresponding semiconductor chip in the other cases.

5. The semiconductor apparatus according to claim 4, wherein the chip enable signal generation unit outputs the clock enable signal as the chip enable signal of the corresponding semiconductor chip when a chip ID signal of a semiconductor chip which is initially set to operate as a master chip is equal to one or more of chip ID signals of the other semiconductor chips, and outputs the transfer clock enable signal as the chip enable signal of the corresponding semiconductor chip in the other cases.

6. The semiconductor apparatus according to claim 1, wherein the clock enable signal is provided only to a semiconductor chip which is initially set to operate as a master chip among the plurality of semiconductor chips.

7. The semiconductor apparatus according to claim 1, wherein the electrical coupling unit comprises a plurality of through-chip vias.

8. A semiconductor apparatus comprising a plurality of semiconductor chips coupled through an electrical coupling unit,
wherein each of the semiconductor chips comprises:
a chip function determination unit configured to determine if a semiconductor chip is to operate as a master chip, through a chip ID signal of the semiconductor chip;
a transmitting unit configured to receive a clock enable signal through an input terminal and form a transfer clock enable signal at an output terminal, according to a determination result of the chip function determination unit;

an error detection unit configured to detect if two or more semiconductor chips operate as the master chip;

a MUX unit configured to receive the transfer clock enable signal or receive the clock enable signal and selectively output the received signal; and a receiving unit configured to output the output of the MUX unit as a chip enable signal, and wherein the semiconductor chip receiving the clock enable signal through the transmitting unit shares the received clock enable signal as the transfer clock enable signal with the other semiconductor chips.

9. The semiconductor apparatus according to claim 8, wherein the transmitting unit receives the clock enable signal through the input terminal, when the corresponding semiconductor chip is determined to be the master chip according to the determination result of the chip function determination unit.

10. The semiconductor apparatus according to claim 8, wherein the error detection unit generates a select signal at a first level when a chip ID signal of a semiconductor chip which is initially set to operate as the master chip is different from chip ID signals of the other semiconductor chips, and generates the select signal at a second level when the chip ID signal of the semiconductor chip which is initially set to operate as the master chip is equal to one or more of the chip ID signals of the other semiconductor chips.

11. The semiconductor apparatus according to claim 10, wherein the MUX unit selects and outputs the transfer clock enable signal when the select signal is at the first level, and selects and outputs the clock enable signal when the select signal is at the second level.

12. The semiconductor apparatus according to claim 8, wherein the clock enable signal is provided only to a semiconductor chip which is initially set to operate as the master chip among the plurality of semiconductor chips.

13. The semiconductor apparatus according to claim 8, wherein the electrical coupling unit comprises a plurality of through-chip vias.

14. A semiconductor system comprising:

a controller; and first and second semiconductor chips electrically coupled through a through-chip via, wherein each of the first and second semiconductor chips comprises:

a chip function determination unit configured to determine if the corresponding semiconductor chip is to operate as a master chip through a chip ID signal;

a transmitting unit configured to receive a clock enable signal through an input terminal and form a transfer clock enable signal at an output terminal, according to the determination result of the chip function determination unit;

an error detection unit configured to detect if an error occurs in the chip ID signals of the first and second semiconductor chips;

a MUX unit configured to select and output any one of the transfer clock enable signal and the clock enable signal; and a receiving unit configured to output the output of the MUX unit as a chip enable signal, wherein the semiconductor chip receiving the clock enable signal through the transmitting unit shares the received clock enable signal as the transfer clock enable signal with the other semiconductor chip, and the controller provides the clock enable signal to a semiconductor chip which is initially set to operate as the master chip among the first and second semiconductor chips.

15. The semiconductor system according to claim 14, wherein the transmitting unit connects the input terminal and the output terminal, when the corresponding semiconductor chip is determined to be the master chip according to the determination result of the chip function determination unit.

16. The semiconductor system according to claim 14, wherein the error detection unit generates a select signal at a first level when the chip ID signals of the first and second semiconductor chips are different from each other, and generates the select signal at a second level when the chip ID signals of the first and second semiconductor chips are equal to each other.

17. The semiconductor system according to claim 16, wherein the MUX unit selects and outputs the transfer clock enable signal when the select signal is at the first level, and selects and outputs the clock enable signal when the select signal is at the second level.

18. A system comprising a plurality of semiconductor chips, wherein each of the semiconductor chips comprise:

a chip ID signal generation unit configured to generate a chip ID signal to identify each semiconductor chip; and a chip enable signal generation unit configured to generate a chip enable signal in response to the chip ID signal and receive a clock enable signal to output as a transfer clock enable signal.

19. The system of claim 18, wherein the chip enable signal generation unit receives the clock enable signal and outputs the transfer clock signal when one of the semiconductor chips is determined to be a master chip.

20. The system of claim 18, wherein the chip enable signal generation unit is configured to determine whether or not to receive the clock enable signal in response to the chip ID signal.

* * * * *